(12) United States Patent
Shimazu et al.

(10) Patent No.: US 8,829,535 B2
(45) Date of Patent: Sep. 9, 2014

(54) SILICON CARBIDE SEMICONDUCTOR DEVICE

(71) Applicant: Sumitomo Electric Industries, Ltd., Osaka (JP)

(72) Inventors: Mitsuru Shimazu, Osaka (JP); Toru Hiyoshi, Osaka (JP); Keiji Wada, Osaka (JP); Takeyoshi Masuda, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/722,486

(22) Filed: Dec. 20, 2012

(65) Prior Publication Data

US 2013/0193447 A1     Aug. 1, 2013

Related U.S. Application Data

(60) Provisional application No. 61/593,681, filed on Feb. 1, 2012, provisional application No. 61/602,386, filed on Feb. 23, 2012.

(30) Foreign Application Priority Data

Feb. 23, 2012 (JP) ................. 2012-036988

(51) Int. Cl.
*H01L 29/16* (2006.01)
*H01L 21/20* (2006.01)

(52) U.S. Cl.
CPC .................. *H01L 29/1608* (2013.01)
USPC ............. 257/77; 257/76; 257/255; 438/585; 438/478

(58) Field of Classification Search
CPC ....... H01L 29/78; H01L 29/12; H01I 29/1608
See application file for complete search history.

(56) References Cited

U.S. PATENT DOCUMENTS

| | | | |
|---|---|---|---|
| 2011/0165764 A1 | 7/2011 | Sasaki et al. | |
| 2011/0175110 A1* | 7/2011 | Wada et al. | 257/77 |
| 2011/0210342 A1* | 9/2011 | Sasaki et al. | 257/77 |
| 2011/0260175 A1* | 10/2011 | Hiyoshi et al. | 257/77 |
| 2011/0297963 A1* | 12/2011 | Honaga et al. | 257/77 |
| 2012/0184113 A1 | 7/2012 | Inoue et al. | |

FOREIGN PATENT DOCUMENTS

| | | |
|---|---|---|
| JP | 2002-261041 A | 9/2002 |
| JP | 2002-261275 A | 9/2002 |
| JP | 2012-004494 A | 1/2012 |
| WO | WO-2010/131572 A1 | 11/2010 |

OTHER PUBLICATIONS

International Search Report and Written Opinion in International Patent Application No. PCT/JP2012/082493, dated Feb. 26, 2013.

* cited by examiner

*Primary Examiner* — Marc Armand
*Assistant Examiner* — Quinton Brasfield
(74) *Attorney, Agent, or Firm* — Venable LLP; Michael A. Sartori; George L. Howarah

(57) ABSTRACT

A silicon carbide semiconductor device includes an insulation film, and a silicon carbide layer having a surface covered with the insulation film. The surface includes a first region. The first region has a first plane orientation at least partially. The first plane orientation is any of a (0-33-8) plane, (30-3-8) plane, (-330-8) plane, (03-3-8) plane, (-303-8) plane, and (3-30-8) plane.

26 Claims, 12 Drawing Sheets

T1  306  T2     T1  306  T2     T1  306  T2

CURRENT DIRECTION // [11-20]

CURRENT DIRECTION ⊥ [11-20]

SILICON CARBIDE SEMICONDUCTOR DEVICE

BACKGROUND OF THE INVENTION

1. Field of the Invention

The present invention relates to a silicon carbide semiconductor device, more particularly a silicon carbide semiconductor device including a silicon carbide layer having a surface covered with an insulation film.

2. Description of the Background Art

Japanese Patent Laying-Open No. 2002-261275 discloses the following contents. In a MOS (Metal Oxide Semiconductor) device, the plane of 4H type SiC with an oxide film stacked is a {03-38} plane or a plane having an off angle within 10° relative to the {03-38} plane. Accordingly, the channel mobility of the MOS device can be increased. This is probably because the density of dangling bonds per unit area of the constituent atom is high due to the SiC {0001} plane being a hexagonal close-packed plane, such that the interface state is increased to impede mobility of electrons, whereas the {03-38} plane is deviated from the hexagonal close-packed plane, such that electrons readily move. Furthermore, the reason why particularly high channel mobility is achieved at the {03-38} plane is probably due to the atomic bondings appearing at the surface relatively periodically despite being different from the close-packed plane.

Sufficiently high channel mobility may not be obtained by the method set forth above.

SUMMARY OF THE INVENTION

The present invention is directed to solving the aforementioned problem. An object of the present invention is to provide a silicon carbide semiconductor device that can achieve higher channel mobility.

A silicon carbide semiconductor device according to an aspect of the present invention includes an insulation film, and a silicon carbide layer having a surface covered with the insulation film. The surface includes a first region. The first region has a first plane orientation at least partially. The first plane orientation is any of a (0-33-8) plane, (30-3-8) plane, (-330-8) plane, (03-3-8) plane, (-303-8) plane, and (3-30-8) plane. According to the silicon carbide semiconductor device, the silicon carbide layer can have high channel mobility on the surface covered with the insulation film.

The surface of the silicon carbide layer may further include a second region. The second region has a second plane orientation differing from the first plane orientation at least partially. The second plane orientation is any of the (0-33-8) plane, (30-3-8) plane, (-330-8) plane, (03-3-8) plane, (-303-8) plane, and (3-30-8) plane. Accordingly, planes differing from each other and having high channel mobility can be provided at the silicon carbide semiconductor device.

The surface of the silicon carbide layer may further include third to sixth regions. The third to sixth regions have third to sixth plane orientations, respectively, at least partially. The first to sixth plane orientations differ from each other. Each of the first to sixth plane orientations is any of the (0-33-8) plane, (30-3-8) plane, (-330-8) plane, (03-3-8) plane, (-303-8) plane, and (3-30-8) plane. Accordingly, six different planes having high channel mobility can be provided at the silicon carbide semiconductor device.

A silicon carbide semiconductor device according to another aspect of the present invention includes an insulation film, and a silicon carbide layer having a surface covered with the insulation film. The surface includes a first region. The first region has a first plane orientation at least partially. The off orientation of the first plane orientation to a {0001} plane is within the range of ±5° to a <1-100> direction. The off angle of the first plane orientation to a {03-38} plane in the <1-100> direction is greater than or equal to −3° and less than or equal to 3°. The inclination of the first plane orientation to a (000-1) plane is less than 90°. According to the silicon carbide semiconductor device, the silicon carbide layer can have high channel mobility on the surface covered with the insulation film.

The surface of the silicon carbide layer may further include a second region. The second region has a second plane orientation differing from the first plane orientation, at least partially. The off orientation of the second plane orientation to the {0001} plane is within the range of ±5° to the <1-100> direction. The off angle of the second plane orientation to the {03-38} plane in the <1-100> direction is greater than or equal to −3° and less than or equal to 3°. The inclination of the second plane orientation to the (000-1) plane is less than 90°. Accordingly, planes differing from each other, having high channel mobility can be provided at the silicon carbide semiconductor device.

The surface of the silicon carbide layer may further include third to sixth regions. The third to sixth regions have third to sixth plane orientations, respectively, at least partially. The first to sixth plane orientations differ from each other. The off orientation of each of the first to sixth plane orientations to the {0001} plane is within the range of ±5° to the <1-100> direction. The off angle of each of the first to sixth plane orientations to the {03-38} plane in the <1-100> direction is greater than or equal to −3° and less than or equal to 3°. The inclination of each of the first to sixth plane orientations to the (000-1) plane is less than 90°. Accordingly, six different planes having high channel mobility can be provided at the silicon carbide semiconductor device.

The silicon carbide semiconductor device of the present invention may further include a gate electrode provided on the insulation film. Accordingly, the channel can be controlled by the insulation gate. The gate electrode may constitute a trench gate structure. The gate electrode may constitute a planar gate structure.

The interface between the silicon carbide layer and the insulation film has an interface state density below $5 \times 10^{11}$ cm$^{-2}$ eV$^{-1}$. Accordingly, higher channel mobility can be obtained more reliably.

The silicon carbide layer may have channel mobility higher than or equal to 70 cm$^2$/Vs at room temperature on the surface. In this case, the silicon carbide layer may have an impurity concentration greater than or equal to $1 \times 10^{17}$ cm$^{-3}$ on the surface. In this case, the silicon carbide semiconductor device may have a threshold value greater than or equal to 4V.

The silicon carbide layer may have channel mobility higher than or equal to 100 cm$^2$/Vs at room temperature on the surface. In this case, the silicon carbide layer may have an impurity concentration greater than or equal to $2 \times 10^{16}$ cm$^{-3}$. In this case, the silicon carbide semiconductor device may have a threshold value greater than or equal to 2.5V.

The silicon carbide semiconductor device may have an S value less than or equal to 200 mV/decade. Accordingly, a more rapid switching property can be obtained.

According to the present invention, a silicon carbide semiconductor device having high channel mobility can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
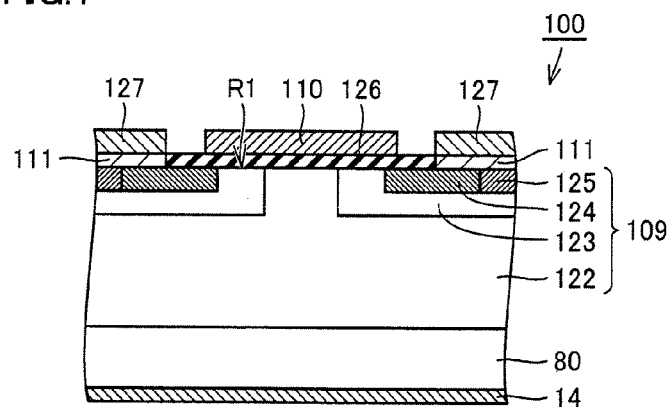
FIG. 1 is a partial sectional view schematically representing a configuration of a silicon carbide semiconductor device according to a first embodiment of the present invention.

Embodiments of the present invention will be described hereinafter based on the drawings. In the drawings, the same or corresponding elements have the same reference characters denoted, and description thereof will not be repeated.

First Embodiment

As shown in FIG. 1, a silicon carbide semiconductor device of the present embodiment is an MOSFET (Metal Oxide Semiconductor Field Effect Transistor) 100, specifically a vertical type DiMOSFET (Double Implanted MOSFET). MOSFET 100 includes a gate insulation film 126 (insulation film), an epitaxial layer 109 (silicon carbide layer), a single crystal substrate 80, a source electrode 111, an upper source electrode 127, a gate electrode 110, and a drain electrode 14. Epitaxial layer 109 includes a breakdown voltage holding layer 122, a p region 123, an n$^+$ region 124, and a p$^+$ region 125.

Epitaxial layer 109 has a crystal structure of the hexagonal system. Epitaxial layer 109 includes a first region R1 at the surface. First region R1 has a first plane orientation at least partially. The first plane orientation is substantially any of the (0-33-8) plane, (30-3-8) plane, (-330-8) plane, (03-3-8) plane, (-303-8) plane, and (3-30-8) plane.

In other words, the off orientation of the first plane orientation to the {0001} plane is within the range of ±5° to the <1-100> direction. The off angle of the first plane orientation to the {03-38} plane in the <1-100> direction is greater than or equal to −3° and less than or equal to 3°. The inclination of the first plane orientation to the (000-1) plane is less than 90°.

Single crystal substrate 80 is made of silicon carbide (SiC) and has n type conductivity. Breakdown voltage holding layer 122 is provided on single crystal substrate 80, and made of silicon carbide of n type conductivity. For example, breakdown voltage holding layer 122 has a thickness of 10 μm, and the concentration of the n type conductive impurities is $5 \times 10^{15}$ cm$^{-3}$.

At the surface of breakdown voltage holding layer 122 are provided a plurality of p regions 123 of p conductivity type, spaced apart from each other. In each p region 123, an n+ region 124 is provided at the surface layer of p region 123. P region 123 constitutes first region R1 at the surface of epitaxial layer 109. The impurity concentration of p region 123 is selected in accordance with the threshold voltage of MOSFET 100.

A p+ region 125 is provided at the surface of breakdown voltage holding layer 122. P+ region 125 is located adjacent to n+ region 124.

A gate insulation film 126 covering first region R1 is provided on breakdown voltage holding layer 122 exposed between adjacent p regions 123. Specifically, gate insulation film 126 extends from above n+ region 124 at one of p regions 123, over the one p region 123, breakdown voltage holding layer 122, the other p region 123, as far as above n+ region 124 at the other p region 123. A gate electrode 110 having a planar gate structure is provided on gate insulation film 126. Furthermore, a source electrode 111 is provided on n+ region 124 and p+ region 125. Upper source electrode 127 is provided on this source electrode 111.

The interface between first region R1 at the surface of epitaxial layer 109 and gate insulation film 126 has an interface state density below $5\times10^{11}$ cm$^{-2}$ eV$^{-1}$. Further, epitaxial layer 109 has channel mobility higher than or equal to 70 cm$^2$/Vs on first region R1 at room temperature. In this case, p region 123 constituting first region R1 has an impurity concentration greater than or equal to $1\times10^{17}$ cm$^{-3}$ on the surface. In this case, the silicon carbide semiconductor device may have a threshold value greater than or equal to 4V. Alternatively, epitaxial layer 109 may have channel mobility higher than or equal to 100 cm$^2$/Vs on first region R1 at room temperature. In this case, p region 123 constituting first region R1 may have an impurity concentration greater than or equal to $2\times10^{16}$ cm$^{-3}$ on the surface. In this case, the silicon carbide semiconductor device may have a threshold value greater than or equal to 2.5V.

MOSFET 100 may have an S value less than or equal to 200 mV/decade. The definition of the S value will be provided afterwards.

A method for manufacturing MOSFET 100 will be described hereinafter.

Figure 2:
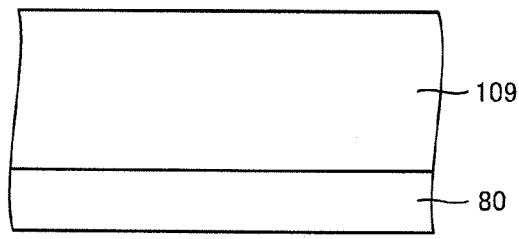
FIG. 2 is a partial sectional view schematically representing a first step in a method for manufacturing a silicon carbide semiconductor device of FIG. 1.

As shown in FIG. 2, epitaxial layer 109 is formed on single crystal substrate 80. The conductivity type and impurity concentration of epitaxial layer 109 are set identical to those of breakdown voltage holding layer 122 (FIG. 1), for example.

Figure 3:
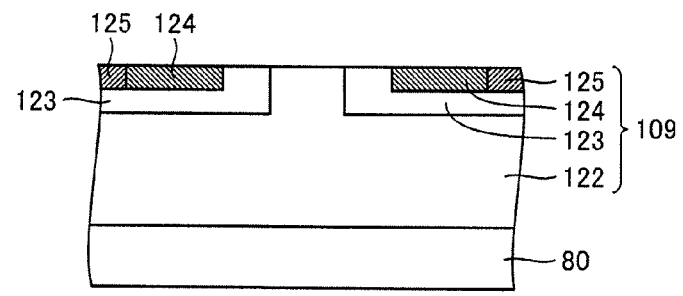
FIG. 3 is a partial sectional view schematically representing a second step in a method for manufacturing a silicon carbide semiconductor device of FIG. 1.

As shown in FIG. 3, p region 123, n+ region 124, and p+ region 125 are formed. Specifically, implantation of impurity ions, followed by activation annealing are carried out. Activation annealing is carried out for 30 minutes at the heat temperature of 1700° C. in an argon atmosphere, for example.

Figure 4:
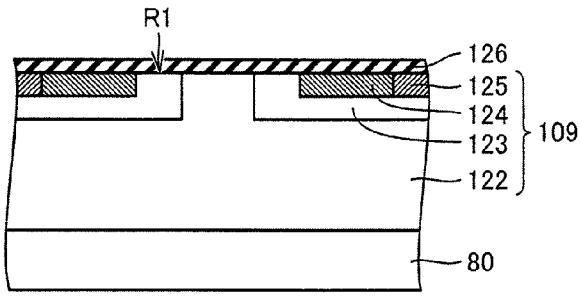
FIG. 4 is a partial sectional view schematically representing a third step in a method for manufacturing a silicon carbide semiconductor device of FIG. 1.

As shown in FIG. 4, gate insulation film 126 is formed so as to cover breakdown voltage holding layer 122, p region 123, and n+ region 124 and p+ region 125. This formation may be performed by thermal oxidation. Thermal oxidation is carried out by heating for 30 minutes at 1200° C. in an oxidation atmosphere. Preferably, nitridation annealing is carried out thereafter. Specifically, annealing is carried out in nitric oxide (NO) atmosphere. The process conditions thereof include, for example, a heating temperature of 1100° C. and a heating time of 120 minutes. As a result, nitrogen atoms are introduced around the interface between gate insulation film 126 and each of breakdown voltage holding layer 122, p region 123, and n+ region 124 and p+ region 125. Following this annealing step using nitric oxide, a further annealing step using argon (Ar) gas that is inactive gas may be carried out. The process conditions thereof include, for example, a heating temperature of 1100° C. and a heating time of 60 minutes.

Figure 5:
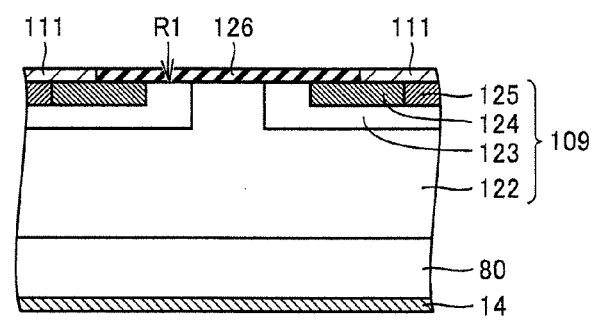
FIG. 5 is a partial sectional view schematically representing a fourth step in a method for manufacturing a silicon carbide semiconductor device of FIG. 1.

As shown in FIG. 5, source electrode 111 and drain electrode 14 are formed. For example, forming a nickel electrode and thermal treatment to obtain ohmic contact are carried out. This thermal treatment is carried out for 2 minutes at 950° C. in inert gas, for example.

Referring to FIG. 1 again, an upper source electrode 127 is formed on source electrode 111. Gate electrode 110 is formed on gate insulation film 126. Thus, MOSFET 100 is obtained.

According to the present embodiment, epitaxial layer 109 may have high channel mobility on the surface covered with gate insulation film 126. This is due to first region R1 having the aforementioned first plane orientation at least partially.

The interface between epitaxial layer 109 and gate insulation film 126 has an interface state density below $5\times10^{11}$ cm$^{-2}$ eV$^{-1}$. Accordingly, higher channel mobility can be obtained more reliably.

The silicon carbide semiconductor device may have an S value less than or equal to 200 mV/decade. Accordingly, a more rapid switching property can be achieved.

By introducing nitrogen atoms through nitridation annealing, the interface state density between first region R1 at the surface of epitaxial layer 109 and gate insulation film 126 can be further reduced. In the case where annealing in inert gas is carried out subsequently, it is thought that adsorption of nitrogen atoms to the interface can be made more firm.

Second Embodiment

Figure 6:
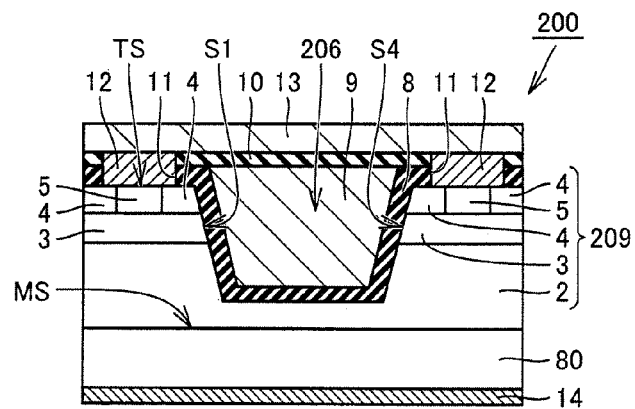
FIG. 6 is a partial sectional view schematically representing a configuration of a silicon carbide semiconductor device according to a second embodiment of the present invention.

As shown in FIG. 6, a silicon carbide semiconductor device of the present embodiment is an MOSFET 200, specifically a vertical type trench gate MOSFET. MOSFET 200 includes a gate insulation film (insulation film), an epitaxial layer 209 (silicon carbide layer), a gate electrode 9, a single crystal substrate 80, a source electrode 12, a source interconnection electrode 13, and an interlayer insulation film 10. Epitaxial layer 209 includes a breakdown voltage holding layer 2 having n type conductivity, a p type body layer 3, an n type source contact layer 4, and a contact region 5 having p type conductivity.

Figure 7:
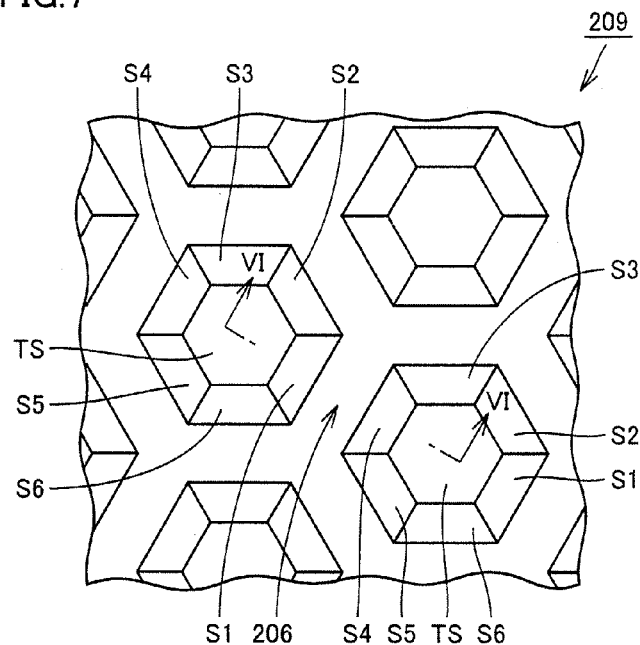
FIG. 7 is a partial plan view schematically representing a configuration of a silicon carbide layer in the silicon carbide semiconductor device of FIG. 6.

Referring to FIGS. 6 and 7, epitaxial layer 209 has a crystal structure of the hexagonal system. Epitaxial layer 209 includes a main surface TS substantially parallel to a main surface MS of single crystal substrate 80. Each of main surfaces MS and TS preferably has an off angle within 5° to the (000-1 plane).

A trench 206 is provided on main surface TS. Trench 206 has side faces S1-S6 (first-sixth regions) as the surface of epitaxial layer 209. Trench 206 has a tapered shape increasing towards the opening, such that side faces S1-S6 are inclined relative to main surface TS. The region of side faces S1-S6 formed by p type body layer 3 constitutes the channel plane of MOSFET 200.

Side faces S1-S6 have first to sixth plane orientations, respectively, at least partially, on p type body layer 3. The first to sixth plane orientations differ from each other. The first to sixth plane orientations are substantially any of the (0-33-8) plane, (30-3-8) plane, (-330-8) plane, (03-3-8) plane, (-303-8) plane, and (3-30-8) plane. In other words, the off orientation of the first to sixth plane orientations to the {0001} is within the range of ±5° to the <1-100> direction. The off angle of the first to sixth plane orientations to the {03-38} plane in the <1-100> direction is greater than or equal to −3° and less than or equal to 3°. The inclination of the first to sixth plane orientations to the (000-1) plane is less than 90°.

When viewed inversely, trench 206 corresponds to a mesa structure with main surface TS as the top face. Preferably, the shape of this top face is a hexagon, as shown in FIG. 7, in the case of hexagonal crystal.

The details of the semiconductor device will be described hereinafter. Breakdown voltage holding layer 2 is formed on one of the main surfaces of single crystal substrate 80. P type body layer 3 is formed on breakdown voltage holding layer 2. N type source contact layer 4 is formed on p type body layer 3. P type contact region 5 is formed so as to be surrounded by n type source contact layer 4. By removing n type source contact layer 4, p type body layer 3 and breakdown voltage holding layer 2 partially, a mesa structure surrounded by trench 206 is formed.

Gate insulation film 8 is formed on side faces S1-S6 and the bottom face of trench 206. This gate insulation film 8 extends as far as the upper face of n type source contact layer 4. Gate electrode 9 is formed on gate insulation film 8, such that the interior of trench 206 is filled (that is, to fill the space between adjacent mesa structures). In other words, gate electrode 9 constitutes a trench gate structure. The upper face of gate electrode 9 is substantially equal in height with the top face of gate insulation film 8 at the region located above the upper surface of n type source contact layer 4.

Interlayer insulation film 10 is formed to cover the portion of gate insulation film 8 extending as far as above the upper face of n type source contact layer 4 and gate electrode 9. By removing interlayer insulation film 10 and a portion of gate insulation film 8, an opening 11 is formed so as to expose a portion of n type source contact layer 4 and p type contact region 5. Source electrode 12 is formed to fill the interior of opening 11, and in contact with p type contact region 5 and a portion of n type source contact layer 4. Source interconnection electrode 13 is formed to be brought into contact with the upper face of source electrode 12, and to extend on the upper face of interlayer insulation film 10. Drain electrode 14 is formed on the back face of single crystal substrate 80, opposite to the main surface where breakdown voltage holding layer 2 is formed. Drain electrode 14 is an ohmic electrode.

The method for manufacturing MOSFET 200 will be described hereinafter.

Figure 8:
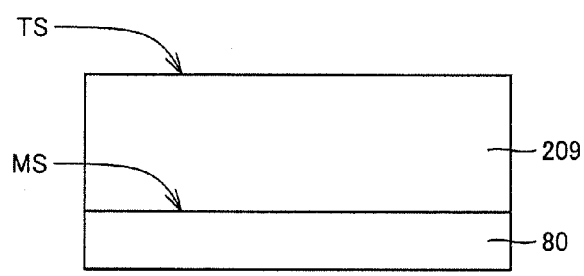
FIG. 8 is a partial sectional view schematically representing a first step in a method for manufacturing a silicon carbide semiconductor device of FIG. 6.

As shown in FIG. 8, epitaxial layer 209 having main surface TS is formed on single crystal substrate 80. Specifically, by epitaxial growth on main surface MS of single crystal substrate 80, epitaxial layer 209 of n conductivity type is formed. This epitaxial growth can be executed by CVD (Chemical Vapor Deposition) using mixture gas of silane ($SiH_4$) and propane ($C_3H_8$) as raw material gas and using hydrogen gas ($H_2$), for example, as the carrier gas. At this stage, nitrogen (N) or phosphorus (P), for example, is preferably introduced as impurities for epitaxial layer 209 to be doped n-type. The impurity concentration can be set greater than or equal to $5 \times 10^{15}$ $cm^{-3}$ and less than or equal to $5 \times 10^{16}$ $cm^{-3}$, for example.

Figure 9:
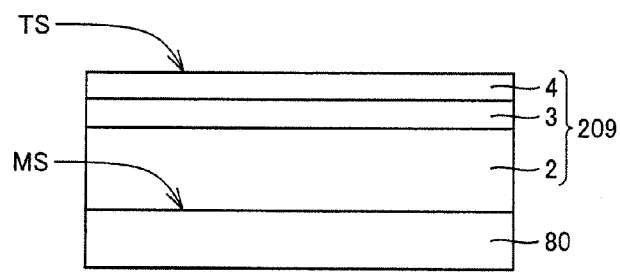
FIG. 9 is a partial sectional view schematically representing a second step in a method for manufacturing a silicon carbide semiconductor device of FIG. 6.

As shown in FIG. 9, breakdown voltage holding layer 2, p type body layer 3 and n type source contact layer 4 are formed on epitaxial layer 209. Specifically, by implanting ions to the upper face layer of epitaxial layer 209, p type body layer 3 and n type source contact layer 4 are formed, and the region not having ions implanted becomes breakdown voltage holding layer 2. As to ion implantation for forming p type body layer 3, impurity ions such as aluminum (Al) are implanted to render p-type. At this stage, the depth of the region where p type body layer 3 is formed can be adjusted by regulating the acceleration energy of implanted ions. Furthermore, by implanting the impurity ions directed to rendering the n-type towards breakdown voltage holding layer 2 having p type body layer 3 formed, n type source contact layer 4 is formed. Impurities for rendering the n-type include phosphorus (P), for example.

Figure 10:
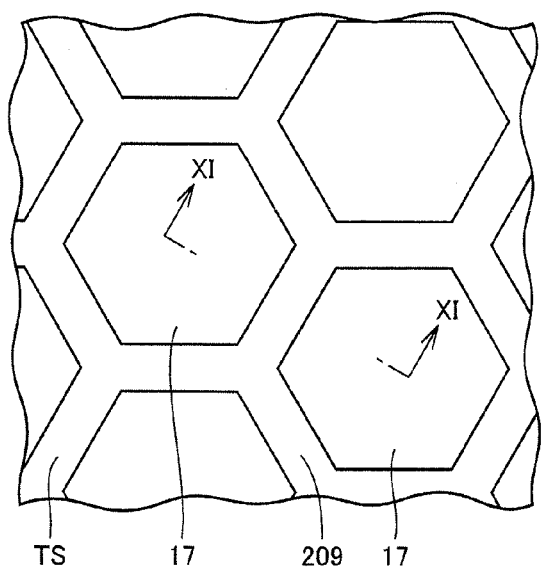
FIG. 10 is a partial plan view schematically representing a third step in a method for manufacturing a silicon carbide semiconductor device of FIG. 6.
Figure 11:
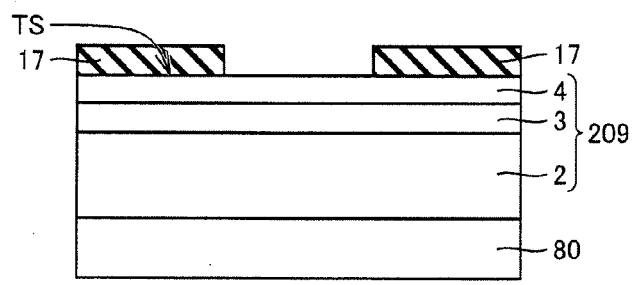
FIG. 11 is a schematic sectional view taken along line XI-XI of FIG. 10.

As shown in FIGS. 10 and 11, a mask 17 is formed to cover a portion of main surface TS of epitaxial layer 209. For mask 17, an insulation film such as a silicon oxide film can be used. Mask 17 can be formed by a method including the steps set forth below, by way of example. A silicon oxide film is formed by CVD or the like on the upper face of n type source contact layer 4. Then, a resist film (not shown) having a predetermined opening pattern is formed by photolithography on the silicon oxide film. Using the resist film as a mask, the silicon oxide film is removed by etching. Then, the resist film is removed. As a result, mask 17 having an opening pattern is formed.

Figure 12:
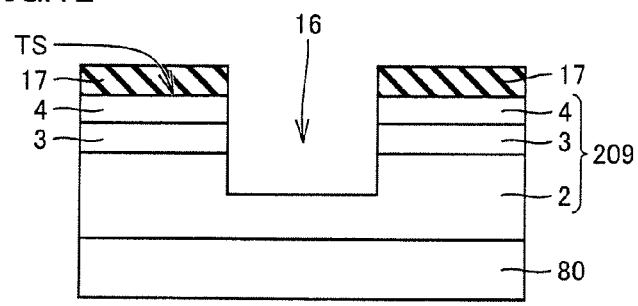
FIG. 12 is a partial sectional view schematically representing a fourth step in a method for manufacturing a silicon carbide semiconductor device of FIG. 6.

As shown in FIG. 12, a recess 16 is formed having a sidewall substantially perpendicular to main surface TS of single crystal substrate 80. Specifically, mask 17 is used to etch n type source contact layer 4, p type body layer 3, and a portion of breakdown voltage holding layer 2. For this etching, reactive ion etching (RIE) or ion milling, for example, may be employed. For RIE, particularly inductively coupled plasma (ICP) RIE can be employed. Specifically, ICP-RIE using $SF_6$ or a mixture gas of $SF_6$ and $O_2$ as reactive gas can be employed.

Figure 13:
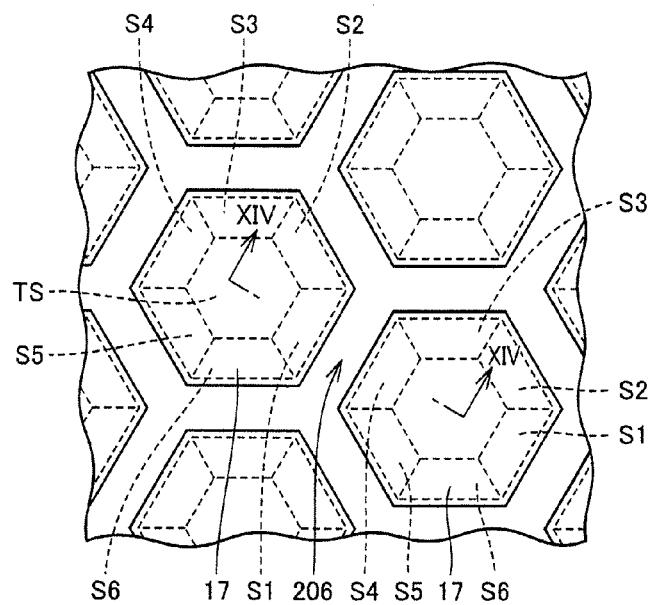
FIG. 13 is a partial plan view schematically representing a fifth step in a method for manufacturing a silicon carbide semiconductor device of FIG. 6.
Figure 14:
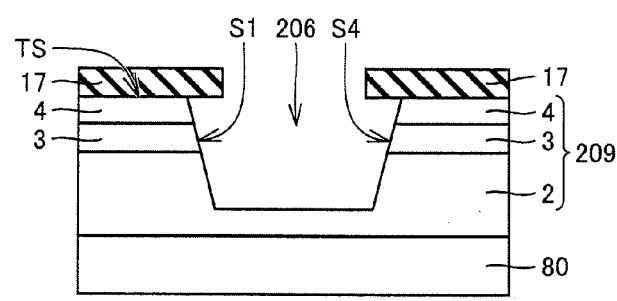
FIG. 14 is a schematic sectional view taken along line XIV-XIV of FIG. 13.

As shown in FIGS. 13 and 14, a trench 206 is formed such that sidewalls S1-S6 inclined relative to main surface TS are provided at epitaxial layer 209. Specifically, main surface TS of epitaxial layer 209 having mask 17 formed is subjected to thermal etching. As used herein, thermal etching is carried out by means of chemical reaction that occurs by supplying process gas including reactive gas to an etching subject that is heated. In the present embodiment, chlorine based gas, preferably chlorine gas, is used for the reactive gas. Thermal etching is carried out preferably in an atmosphere in which the partial pressure of the chlorine based gas is less than or equal to 50%. Thermal etching is carried out in an atmosphere preferably under reduced pressure. More preferably, the atmosphere for etching has reduced pressure less than or equal to 1/10 the atmospheric pressure. Furthermore, thermal etching is preferably carried out under the condition where the temperature of single crystal substrate 80 having epitaxial layer 209 provided (thermal treatment temperature) is greater than or equal to 1000° C.

Details of thermal etching will be described hereinafter by way of example.

Etching is carried out using a mixture gas of oxygen gas and chlorine gas as the reaction gas for the process gas, and at a thermal treatment temperature greater than or equal to 700° C. and less than or equal to 1200° C. The thermal treatment temperature is preferably greater than or equal to 700° C. and less than or equal to 200° C. When this temperature is less than or equal to 1200° C., a quartz member can be employed for the device directed to thermal treatment. The upper limit of the temperature is more preferably 1100° C., further more preferably 1000° C. The lower limit of the temperature is more preferably 800° C., further more preferably 900° C. In this case, the etching rate can take a value sufficiently practical.

As to the conditions for the thermal etching step set forth above, the main reaction proceeds when the conditions of $0.5 \leq x \leq 2.0$ and $1.0 \leq y \leq 2.0$ are satisfied for x and y in the reaction formula represented by $SiC + mO_2 + nCl_2 \rightarrow SiCl_x + CO_y$ (where m, n, x and y are positive numbers). The reaction (thermal etching) is most facilitated under the conditions of x=4 and y=2. It is to be noted that the aforementioned m and n represent the amount of oxygen gas and chlorine gas actually reacting, and do not represent the amount supplied as the process gas. The rate of the flow rate of oxygen to the flow rate of chlorine supplied in this thermal etching is preferably greater than or equal to 0.1 and less than or equal to 2.0. More preferably, the lower limit of this rate is 0.25.

The reaction gas may include carrier gas, in addition to the aforementioned chlorine gas and oxygen gas. For the carrier gas, nitrogen ($N_2$) gas, argon gas, helium gas, or the like may be used by way of example. When the thermal treatment temperature is greater than or equal to 700° C. and less than or equal to 1000° C., as set forth above, the etching rate of SiC becomes approximately 70 µm/hr, for example. When silicon oxide ($SiO_2$) is used for mask 17, the selected ratio of SiC to $SiO_2$ can be set significantly great. Therefore, mask 17 formed of $SiO_2$ substantially will not be etched during SiC etching.

Then, mask 17 is removed by an arbitrary method such as by etching.

Figure 15:
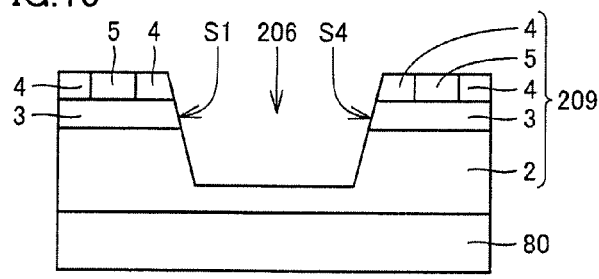
FIG. 15 is a partial sectional view schematically representing a sixth step in a method for manufacturing a silicon carbide semiconductor device of FIG. 6.
Figure 16:
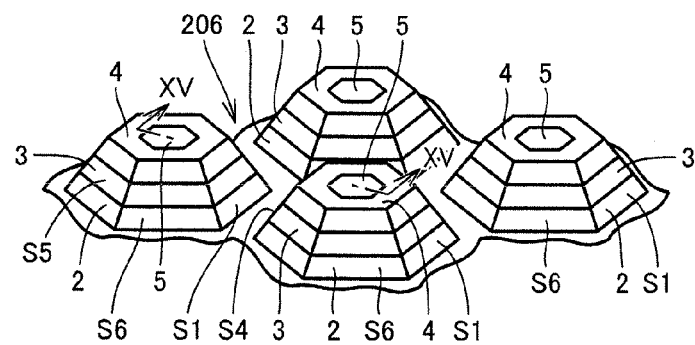
FIG. 16 is a schematic perspective view of FIG. 15.

As shown in FIGS. 15 and 16, contact region 5 is formed. As appreciated from FIG. 16, the plane shape of trench 206 constitutes a mesh formed with each unitary cell (annular trench 206 surrounding one mesa structure) taking a hexagonal shape. P type contact region 5 is arranged substantially at the central region of the upper face of the mesa structure, as shown in FIG. 16. The plane shape of p type contact region 5 is identical to the outer circumferential shape of the upper face of the mesa structure, i.e. a hexagonal shape. Then, the step of activation annealing is performed to render active the impurities implanted by ion-implantation set forth above. In this activation annealing step, the surface of the epitaxial layer made of silicon carbide (for example, the sidewall of the mesa structure) is subjected to annealing without particularly forming a cap layer. Alternatively, activation annealing may be performed with the aforementioned cap layer formed. Further, activation annealing may be performed based on a configuration in which a cap layer is provided only on the upper face of n type source contact layer 4 and p type contact region 5.

Figure 17:
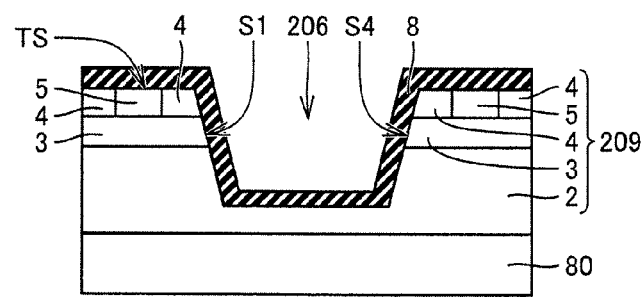
FIG. 17 is a partial sectional view schematically representing a seventh step in a method for manufacturing a silicon carbide semiconductor device of FIG. 6.

As shown in FIG. 17, gate insulation film 8 is formed on side faces S1-S6 of epitaxial layer 209. Specifically, gate insulation film 8 is formed, extending from the interior of trench 206 and as far as above the upper face of n type source contact layer 4 and p type contact region 5. For gate insulation film 8, an oxide film (silicon oxide film) obtained by applying thermal oxidation to epitaxial layer 209, for example, can be employed.

Figure 18:
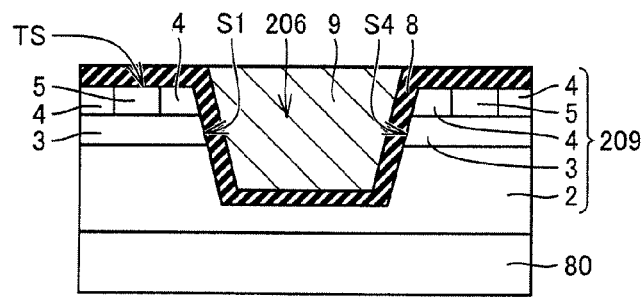
FIG. 18 is a partial sectional view schematically representing an eighth step in a method for manufacturing a silicon carbide semiconductor device of FIG. 6.

As shown in FIG. 18, gate electrode 9 is foiled facing each of side faces S1-S6 of epitaxial layer 209 with gate insulation film 8 therebetween. Specifically, gate electrode 9 is formed on gate insulation film 8 so as to fill the interior of trench 206. Gate electrode 9 can be formed by the method set forth below. First, a conductor film to become a gate electrode is formed by sputtering or the like on gate insulation film 8, inside trench 206 and extending as far as the region above p type contact region 5. For the material of the conductor film, any arbitrary material such as metal can be used as long as the material has conductivity. Then, by using an arbitrary method such as etch-back or CMP (Chemical Mechanical Polishing), the conductor film is removed except for the portion located in trench 206. As a result, the conductor film remains so as to fill the interior of trench 206. This conductor film constitutes gate electrode 9.

Figure 19:
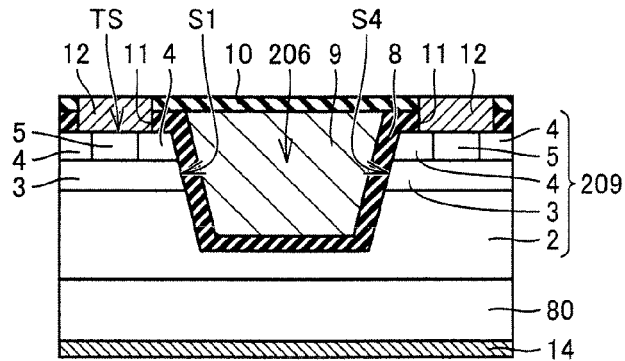
FIG. 19 is a partial sectional view schematically representing a ninth step in a method for manufacturing a silicon carbide semiconductor device of FIG. 6.
Figure 20:
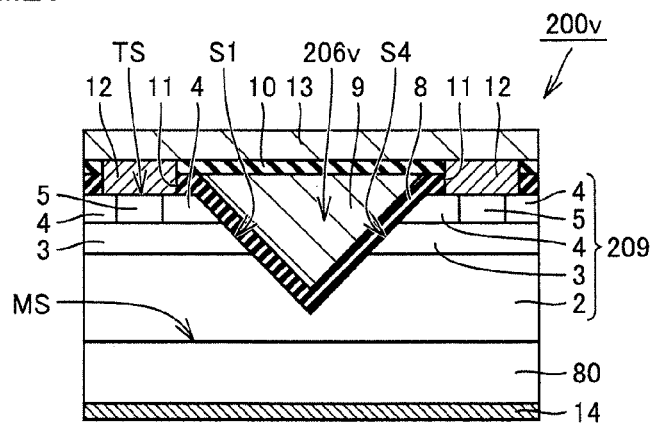
FIG. 20 is a partial sectional view representing an example of modification of the silicon carbide semiconductor device of FIG. 6.

Referring to FIG. 19, interlayer insulation film 10 is formed to cover the upper face of gate electrode 9, and the upper face of gate insulation film 8 exposed at p type contact region 5. For interlayer insulation film 10, any arbitrary material may be employed as long as the material has insulation.

Then, a resist film (not shown) having a pattern is formed by photolithography on interlayer insulation film 10. The resist film has an opening pattern formed at the region located on p type contact region 5. Using this resist film as a mask, interlayer insulation film 10 and gate insulation film 8 are partially removed by etching. As a result, an opening 11 (refer to FIG. 19) is formed in interlayer insulation film 10 and gate insulation film 8. Under this state, p type contact region 5 and a portion of n type source contact layer 4 are exposed at the bottom of opening 11.

Then, a conductor film is formed to fill the interior of opening 11 and to cover the upper face of the aforementioned resist film. Then, by removing the resist film using a chemical solution or the like, the portion of the conductor film formed on the resist film is removed at the same time (lift off). As a result, source electrode 12 is formed by the conductor film in opening 11. Source electrode 12 is an ohmic electrode establishing an ohmic contact with p type contact region 5 and n type source contact layer 4.

Drain electrode 14 is formed at the backside of single crystal substrate 80 (the surface side opposite to the main surface where breakdown voltage holding layer 2 is formed). For drain electrode 14, an arbitrary material can be employed as long as it is capable of forming an ohmic contact with single crystal substrate 80.

Referring to FIG. 6 again, source interconnection electrode 13 is formed by an arbitrary method such as sputtering in contact with the upper face of source electrode 12 and extending on the upper face of interlayer insulation film 10. Thus, MOSFET 200 is obtained.

According to the present embodiment, 6 different planes having high channel mobility can be provided. By utilizing these 6 planes, the channel mobility can be increased at MOSFET 200 having a hexagonal shape as the plane pattern (refer to FIG. 7).

Although trench 206 of MOSFET 200 has a flat bottom plane, a V-shape trench may be formed, such as trench 206V (FIG. 2) of MOSFET 200v. In this case, the MOSFET can be further integrated.

Third Embodiment

Figure 21:
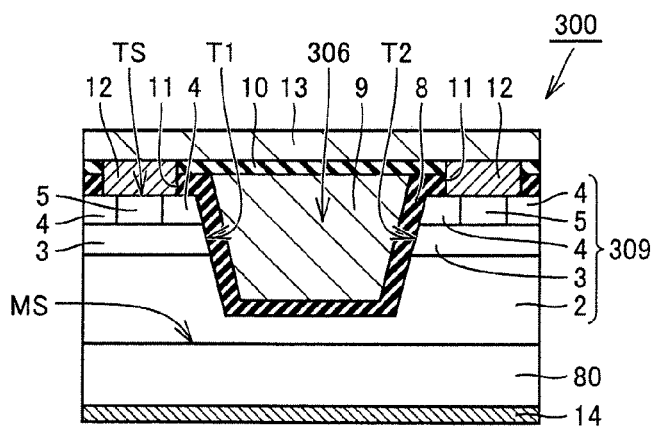
FIG. 21 is a partial sectional view schematically representing a configuration of a silicon carbide semiconductor device according to a third embodiment of the present invention.
Figure 22:
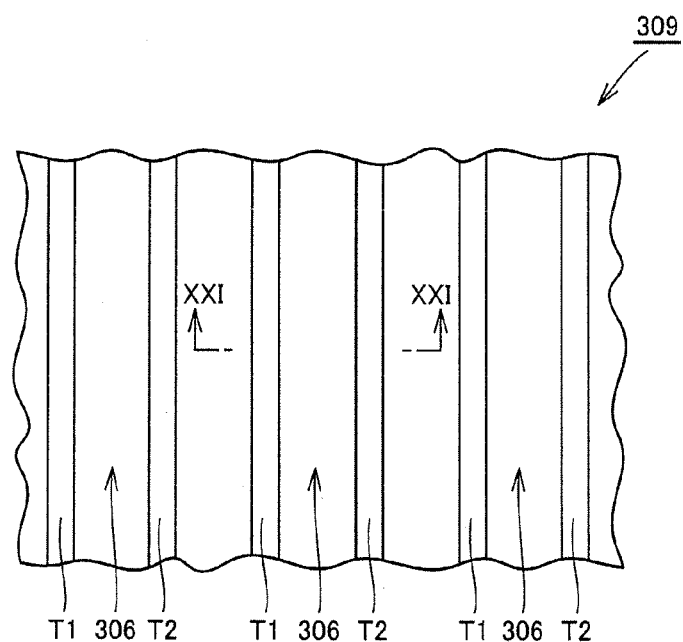
FIG. 22 is a partial plan view schematically representing a configuration of a silicon carbide layer in the silicon carbide semiconductor device of FIG. 21.

As shown in FIG. 21, a silicon carbide semiconductor device of the present embodiment is an MOSFET 300, which is a vertical type trench gate MOSFET, likewise with MOSFET 200 of the second embodiment. MOSFET 300 has an epitaxial layer 309 differing from epitaxial layer 209 (FIG. 7) of MOSFET 200, and includes a trench 306 taking a stripe shape in plan view, as shown in FIG. 22. Trench 306 includes side faces T1 and T2 (first and second regions) as the surface of epitaxial layer 309. Trench 306 has a tapered configuration increasing towards the opening. Therefore, side faces T1 and T2 are inclined relative to main surface TS. The region of side faces T1 and T2 formed by p type body layer 3 constitutes the channel plane of MOSFET 300.

Side faces T1 and T2 have first and second plane orientations, respectively, on p type body layer 3, at least partially. The first and second plane orientations differ from each other. The first and second plane orientations are substantially any of the (0-33-8) plane, (30-3-8) plane, (-330-8) plane, (03-3-8) plane, (-303-8) plane and (3-30-8) plane. In other words, the off orientation of the first and second plane orientations to the {0001} plane is within the range of ±5° to the <1-100> direction. The off angle of the first and second plane orientations to the {03-38} plane in the <1-100> direction is greater than or equal to −3° and less than or equal to 3°. The inclination of the first to sixth plane orientations to the (000-1) plane is less than 90°. For example, the first plane is substantially the (0-33-8) plane and the second plane is substantially the (03-3-8) plane.

According to the present embodiment, two different planes having high channel mobility can be provided. By utilizing these two planes, the channel mobility can be increased at MOSFET 300 having the shape of stripes as a plane pattern (refer to FIG. 22).

(Evaluation of Interface State Density)

Figure 23:
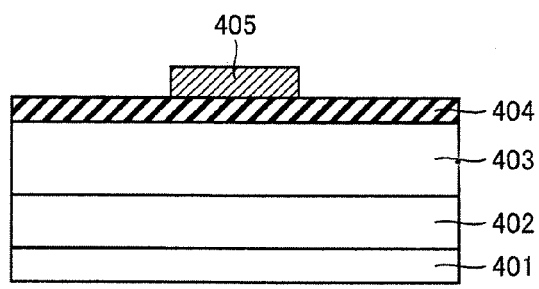
FIG. 23 is a sectional view schematically representing a configuration of an MOS capacitor for measuring the interface state density.

Examples of the measurement results of the interface state density using a MOS capacitor (FIG. 23) will be described.

For an example, a MOS capacitor was produced using a silicon carbide substrate including a top face having a plane orientation of the (0-33-8) plane. As Comparative Example 1, a MOS capacitor was produced using a silicon carbide substrate including a top face having a plane orientation of the (03-38) plane. As Comparative Example 2, a MOS capacitor was produced using a silicon carbide substrate including a top face having a plane orientation of the (0001) plane.

The method for manufacturing a MOS capacitor is as set forth below. First, an n type silicon carbide substrate 402 was prepared. An n type SiC layer 403 was formed on the top face of silicon carbide substrate 402 by epitaxial growth. On n type SiC layer 403, a gate oxide film 404 ($SiO_2$) was formed. Then, annealing was carried out. Specifically, a first annealing in a NO atmosphere and a second annealing in an Ar atmosphere were carried out. Each of the first and second annealing was carried out at the annealing temperature of 1250° C. and annealing time of 1 hour. Then, gate electrode 405 was formed on the gate oxide film by Al deposition. The size of gate electrode 405 was set to 300-500 µmϕ). Also, a contact electrode 401 (Body) was formed on the backside of silicon carbide substrate 402. Specifically, Ni deposition and RTA at 1000° C. in an Ar atmosphere for 2 minutes were carried out.

Figure 24:
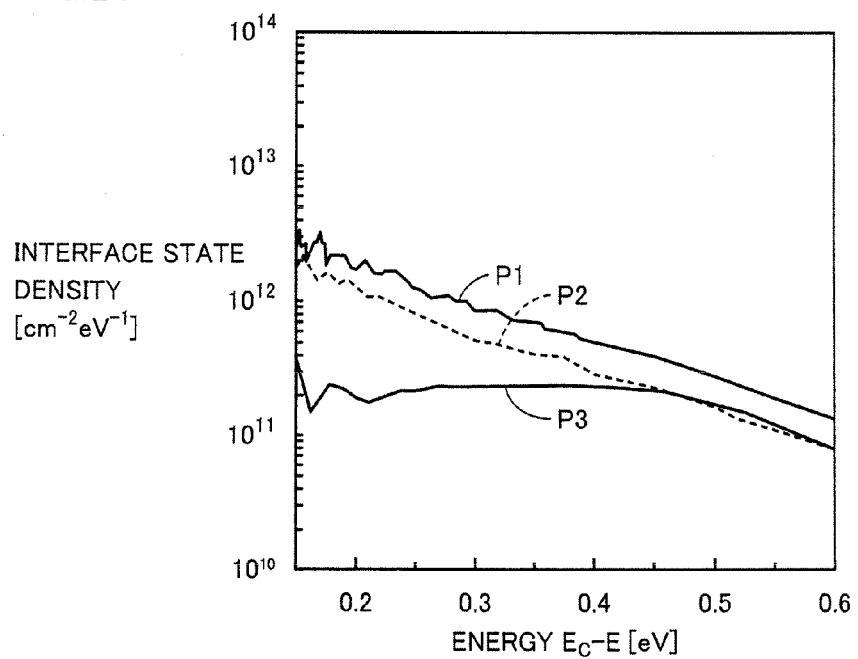
FIG. 24 is a graph representing an example of measurements of the interface state density.

The relationship between energy $E_C$-E with energy $E_C$ of the conduction electron band as the reference and the interface state density was determined (FIG. 24). In the graph, solid line P1 corresponds to the (03-38) plane; broken line P2 corresponds to the (0001) plane; and solid line P3 corresponds to the (0-33-8) plane. In the case of the (0-33-8) plane (solid line P3), the interface state density was below $5 \times 10^{11}$ $cm^{-2}$ $eV^{-1}$ regardless of the value of energy $E_C$-E. In the case of the (0-33-8) plane, the interface state density was substantially constant, and variation thereof was sufficiently within one order in the range where energy $E_C$-E (eV) is greater than or equal to 0 and less than or equal to 0.5. The interface state density was lower for the (0-33-8) plane than for the (03-38) plane. The difference was significant under energy values that were at shallow level from the conduction electron band. In other words, the interface state density on the (0-33-8) plane was lower as compared to that on the (03-38) plane or the (0001) plane. Thus, it is estimated that a more favorable interface is formed on the (0-33-8) plane.

Each of the (30-3-8) plane, (-330-8) plane, (03-3-8) plane, (-303-8) plane and (3-30-8) plane is equivalent to the (0-33-8) plane from the standpoint of the physical properties set forth above.

(Evaluation of Channel Mobility When Impurity Concentration is Low)

Figure 25:
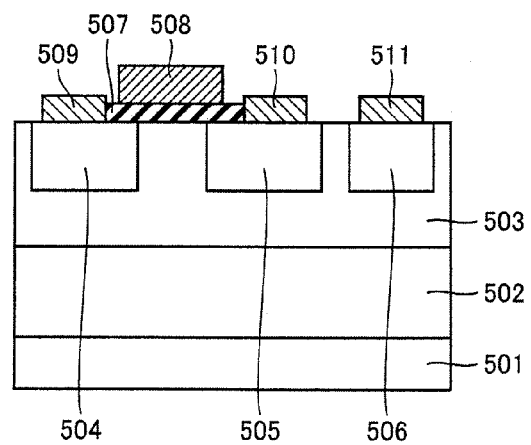
FIG. 25 is a sectional view schematically representing a configuration of an MOSFET for measuring channel property.

An example of measurement results of the channel mobility using a lateral type MOSFET (FIG. 25) will be described hereinafter.

As an example, an MOSFET was produced using a silicon carbide substrate including a top face having a plane orientation of the (0-33-8) plane. Specifically, an MOSFET having the source/drain arranged in a direction parallel to the [11-20] direction (Example 1), and an MOSFET having the source/drain arranged in a direction perpendicular to the [11-20] direction (Example 2) were produced. For a comparative example, an MOSFET was produced using a silicon carbide substrate including a top face having a plane orientation of the (03-38) plane. Specifically, an MOSFET having the source/drain arranged in a direction parallel to the [11-20] direction (Comparative Example 1) and an MOSFET having the source/drain arranged in a direction perpendicular to the [11-20] direction (Comparative Example 2) were produced.

The method of manufacturing an MOSFET is set forth below. An n type SiC layer 502 was formed by epitaxial growth on the top face of n type SiC substrate 501. Al ions were implanted onto n type SiC layer 502 to form a p well layer 503. The impurity concentration and the depth of p well layer 503 were set to approximately $2 \times 10^{16}$ $cm^{-3}$ and approximately 700 nm, respectively. By lithography, an $n^+$ source region 504, an $n^+$ drain region 505, and a $p^+$ body region 506 were formed in p well layer 503. The regions were doped p type and n type using Al ions and P ions, respectively. Then, a cap was formed. Activation annealing was carried out for 20 minutes at 1700° C. in an Ar atmosphere. Then, the epitaxial surface was cleaned by sacrificial oxidation. Next, a gate oxide film 507 ($SiO_2$) was formed, followed by annealing thereof. Specifically, a first annealing in NO atmosphere and a second annealing in an Ar atmosphere were carried out on gate oxide film 507. Each annealing was carried out at the temperature of 1250° C. and for 1 hour. Then, Ni deposition and RTA at 1000° C. in an Ar atmosphere for 2 minutes were carried out on each of $n^+$ source region 504, $n^+$ drain region 505 and $p^+$ body region 506. Furthermore, Al deposition was carried out on each of these regions. Accordingly, a source electrode 509, a drain electrode 510, and a body electrode 511 were formed. Further, a gate electrode 508 was formed by Al deposition on gate oxide film 507.

The main measurement results are shown in the following table.

TABLE 1

| | Example 1 | Example 2 | Comparative Example 1 | Comparative Example 2 |
|---|---|---|---|---|
| Channel plane | (0-33-8) plane | | (03-38) plane | |
| $d_{ox}$ (nm) | 45.2 | | 48.4 | |
| Current direction | // [11-20] | ⊥ [11-20] | // [11-20] | ⊥ [11-20] |
| $V_{th}$ (V) | 2.5 | 2.9 | 9.0 | 8.9 |
| $\mu_{fe\text{-}max}$ ($cm^2$/Vs) | 100.6 | 117.4 | 16.8 | 14.5 |
| S value (mV/decade) | 166 | 160 | 1055 | 1045 |

In the table, $d_{ox}$ indicates the thickness of gate oxide film 507; $V_{th}$ indicates the threshold voltage; and $\mu_{fe\text{-}max}$ indicates the maximum value of the channel mobility. The S value will be described afterwards.

It is appreciated from the results that each $\mu_{fe\text{-}max}$ of Examples 1 and 2 was greater than that of each of Comparative Examples 1 and 2. The difference between Examples 1 and 2, i.e. the difference in the channel direction, did not greatly affect $\mu_{fe\text{-}max}$. The reason why the (0-33-8) plane has a higher $\mu_{fe\text{-}max}$ is probably because the (0-33-8) plane has a lower interface state density than the (03-38) plane.

Figure 26:
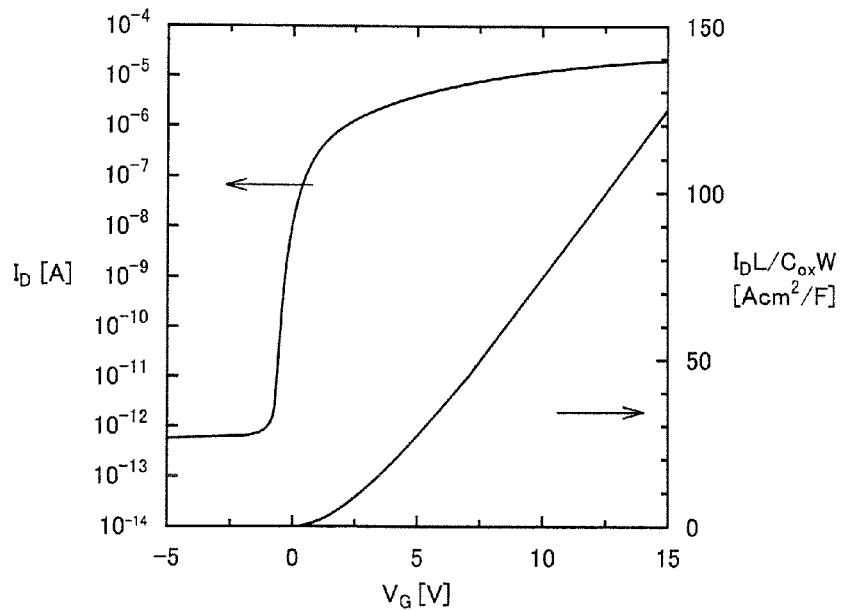
FIG. 26 is a graph representing measurement results of drain current in Example 1.
Figure 27:
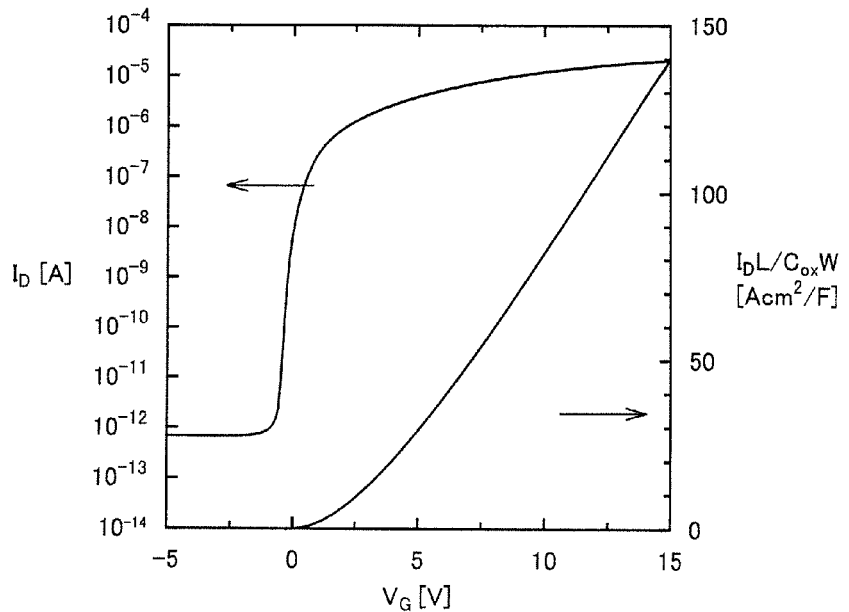
FIG. 27 is a graph representing measurement results of drain current in Example 2.

The graph in each of FIGS. 26 and 27 indicates the drain current $I_D$ to the gate voltage $V_G$ in Examples 1 and 2. The vertical axis at the left side is based on the log scale. The vertical axis at the right side is based on a linear scale and has a coefficient $L/C_{OX}W$ applied. L indicates the channel length, which was set at 100 µm. W indicates the channel width, which was set at 200 µm. $C_{OX}$ indicates the capacitance of gate oxide film 507.

Each of the (30-3-8) plane, (-330-8) plane, (03-3-8) plane, (-303-8) plane and (3-30-8) plane is equivalent to the (0-33-8) plane from the standpoint of physical properties set forth above. Although the impurity concentration of p well layer 503 in Examples 1 and 2 was set to approximately $2 \times 10^{16}$ cm$^{-3}$, the threshold value of gate voltage $V_G$ could be set greater than or equal to 2.5V even if the impurity concentration was reduced as low as $1 \times 10^{16}$ cm$^{-3}$.

(Evaluation of Channel Mobility When Impurity Concentration is High)

Figure 28:
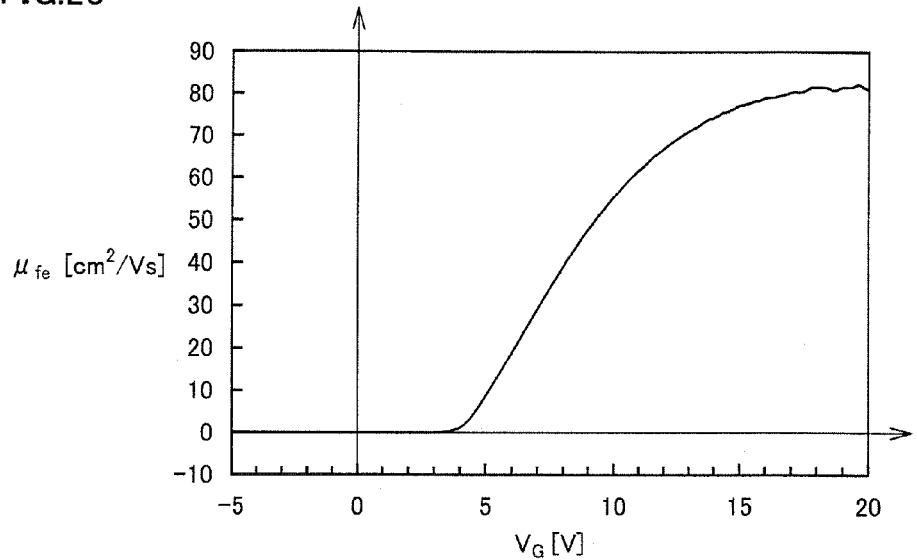
FIG. 28 is a graph representing measurement results of channel mobility in Example 3.

In Examples 1 and 2 set forth above, the impurity concentration of p well layer 503, i.e. the impurity concentration of the channel, was set to approximately $2 \times 10^{16}$ cm$^{-3}$. In Example 3, the impurity concentration was set to $1 \times 10^{17}$ cm$^{-3}$. The remaining conditions are substantially similar to those of the examples set forth above. From the measured results of channel mobility $\mu_{fe}$ of Example 3 (FIG. 28) when the drain voltage $V_D$ was set at 0.1V, the maximum channel mobility $\mu_{fe\text{-}max}$ was higher than or equal to 70 cm$^2$/Vs. The threshold voltage $V_{th}$ was 4.5V.

Figure 29:
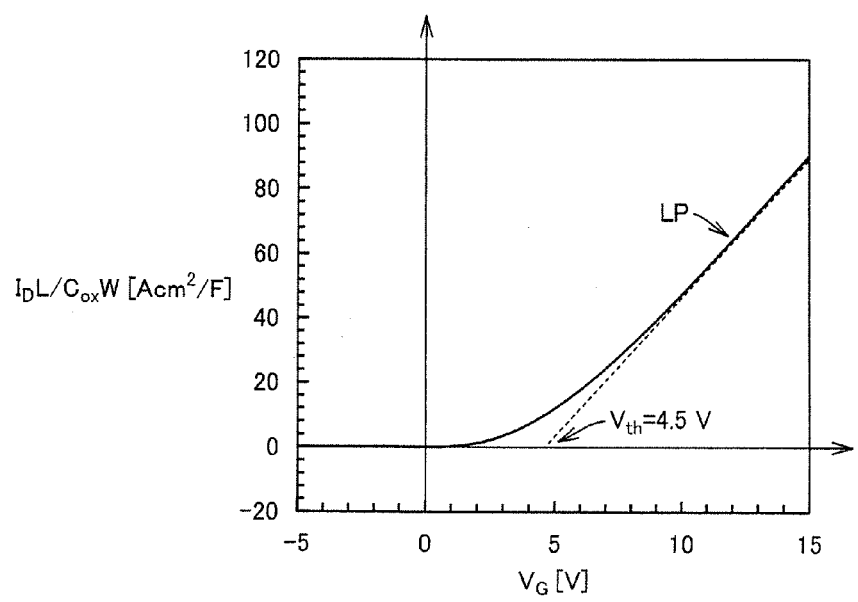
FIG. 29 is a graph representing measurement results of drain current in Example 3 and a method for calculating threshold voltage $V_{th}$ using the same.

Threshold voltage $V_{th}$ in the present specification was obtained by carrying out approximation by linear function to the linear increase region LP of $I_D L/C_{OX} W$, as shown in FIG. 29, and using the crossing point between this function and the $V_G$ axis. Details of the method for calculating this $V_{th}$ will be described hereinafter.

Drain current $I_D$ is represented by the following equation (1), where $\mu$ is the channel mobility and $V_D$ is the drain voltage.

$$I_D = \mu W C_{ox} V_D (V_G - V_D/2 - V_{th})/L \quad (1)$$

A modification of equation (1) submits the following equation (2)

$$I_D L/C_{ox} W = \mu V_D (V_G - V_D/2 - V_{th}) \quad (2)$$

Equation (2) is a linear function with $V_G$ as a variable. The portion represented by this function corresponds to the linear increase region LP (FIG. 29). When the value of $V_G$ at the crossing point with the gate voltage $V_G$ axis when linear increase region LP is extrapolated is X, the value in the parentheses of equation (2) becomes zero at $V_G$=X. Namely, $X = V_D/2 + V_{th}$. Therefore, by $V_{th} = X - V_D/2$, threshold voltage $V_{th}$ can be obtained.

(Evaluation of S Value)

S value is also referred to as the subthreshold coefficient. Referring to Table 1 set forth above, the S values of Examples 1 and 2 were both less than 200 mV/decade, which are significantly lower than the S values of Comparative Examples 1 and 2. It is therefore appreciated that a silicon carbide semiconductor device having a rapid switching property can be obtained by using the (0-33-8) plane corresponding to Examples 1 and 2 as the channel.

Each of the (30-3-8) plane, (-330-8) plane, (03-3-8) plane, (-303-8) plane and (3-30-8) plane is equivalent to the (0-33-8) plane from the standpoint of the physical properties set forth above.

S value is defined as set forth below.

$$S = \left( \frac{d(\log_{10} I_D)}{dV_G} \right)^{-1} \quad (3)$$

Figure 30:
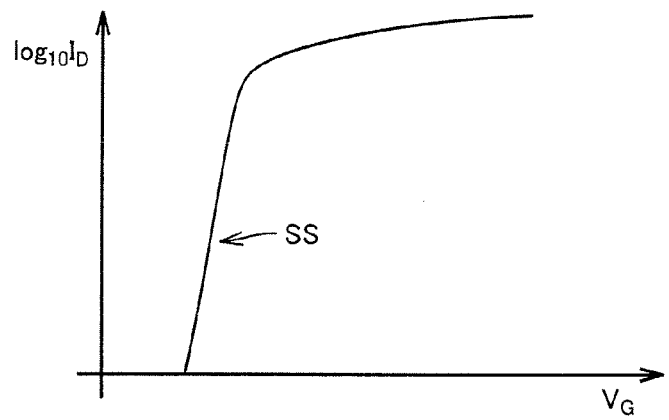
FIG. 30 is a graph for describing a method for calculating an S value.

The differential of Equation (3) corresponds to the region where $\log_{10} I_D$ increases linearly in accordance with the increase of gate voltage $V_G$ (subthreshold slope SS in FIG. 30). The value is calculated based on the average from the data in 0.1 V steps in the range of $V_{th} \leq V_G \leq V_{th} + 0.3$ (V), for example.

(When the Surface of Silicon Carbide Layer is Formed from Composite Plane)

Figure 31:
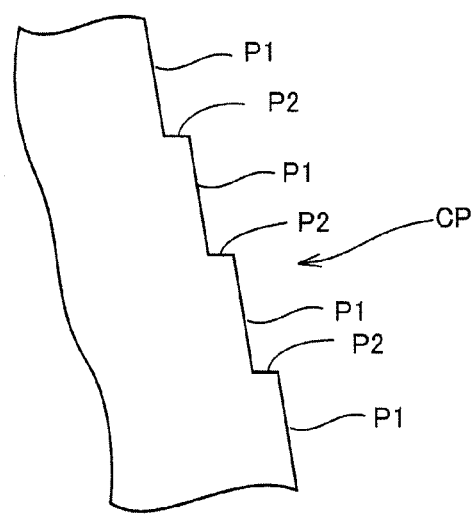
FIG. 31 is a partial sectional view representing an example of the surface of a composite plane of the silicon carbide layer.

The surface of the silicon carbide layer (for example, epitaxial layer 209 of FIG. 6) may have a region (for example, side face S1 of FIG. 6 as the first region) constituted of a composite plane CP (FIG. 31) having a specific plane orientation partially. As used herein, a specific plane orientation is any of the (0-33-8) plane, (30-3-8) plane, (-330-8) plane, (03-3-8) plane, (-303-8) plane and (3-30-8) plane. A composite plane CP includes a first portion P1 formed of a first plane and a second portion R2 formed of another plane differing from the first plane, when viewed microscopically. As used herein, "microscopically" implies taking into account the dimension of approximately interatomic spacing. For example, each of first and second portions P1 and P2 may have a width dimension approximately two times the interatomic spacing in the aligning direction of adjacent first and second portions P1 and P2 (periodic direction), and a dimension sufficiently greater than the interatomic spacing in the direction crossing the periodic direction.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A silicon carbide semiconductor device comprising:
an insulation film, and
a silicon carbide layer having a surface covered with said insulation film, said surface including a first region, said first region having a first plane orientation at least partially, said first plane orientation being any of a (0-33-8) plane, (30-3-8) plane, (-330-8) plane, (03-3-8) plane, (-303-8) plane, and (3-30-8) plane,
wherein
said surface of said silicon carbide layer further includes a second region, said second region having a second plane orientation differing from said first plane orientation, at least partially,
said second plane orientation is any of the (0-33-8) plane, (30-3-8) plane, (-330-8) plane, (03-3-8) plane, (-303-8) plane, and (3-30-8) plane.

2. The silicon carbide semiconductor device according to claim 1, wherein
said surface of said silicon carbide layer further includes third to sixth regions, said third to sixth regions, at least partially, having third to sixth plane orientations respectively, said first to sixth plane orientations differing from each other, and
each of said first to sixth plane orientations is any of the (0-33-8) plane, (30-3-8) plane, (-330-8) plane, (03-3-8) plane, (-303-8) plane, and (3-30-8) plane.

3. The silicon carbide semiconductor device according to claim 1, wherein an interface between said silicon carbide layer and said insulation film has an interface state density less than $5 \times 10^{11}$ cm$^{-2}$ eV$^{-1}$.

4. The silicon carbide semiconductor device according to claim 1, wherein said silicon carbide semiconductor device has an S value less than or equal to 200 mV/decade.

5. The silicon carbide semiconductor device according to claim 1, further comprising a gate electrode provided on said insulation film.

6. The silicon carbide semiconductor device according to claim 5, wherein said gate electrode constitutes a trench gate structure.

7. The silicon carbide semiconductor device according to claim 5, wherein said gate electrode constitutes a planar gate structure.

8. The silicon carbide semiconductor device according to claim 1, wherein said silicon carbide layer has channel mobility higher than or equal to 70 cm$^2$/Vs at room temperature on said surface.

9. The silicon carbide semiconductor device according to claim 8, wherein said silicon carbide layer has an impurity concentration greater than or equal to $1 \times 10^{17}$ cm$^{-3}$ on said surface.

10. The silicon carbide semiconductor device according to claim 9, wherein said silicon carbide semiconductor device has a threshold value greater than or equal to 4V.

11. The silicon carbide semiconductor device according to claim 1, wherein said silicon carbide layer has channel mobility higher than or equal to 100 cm$^2$/Vs at room temperature on said surface.

12. The silicon carbide semiconductor device according to claim 11, wherein said silicon carbide layer has an impurity concentration greater than or equal to $2 \times 10^{16}$ cm$^{-3}$ on said surface.

13. The silicon carbide semiconductor device according to claim 12, wherein said silicon carbide semiconductor device has a threshold value greater than or equal to 2.5V.

14. A silicon carbide semiconductor device comprising:
an insulation film, and
a silicon carbide layer having a surface covered with said insulation film, said surface including a first region, said first region having a first plane orientation at least partially, an off orientation of said first plane orientation to a {0001} plane being within a range of ±5° to a <1-100> direction, an off angle of said first plane orientation to a {03-38} plane in the <1-100> direction being greater than or equal to −3° and less than or equal to 3°, and an inclination of said first plane orientation to a (000-1) plane being less than 90°,
wherein
said surface of said silicon carbide layer further includes a second region, said second region having a second plane orientation differing from said first plane orientation at least partially, an off orientation of said second plane orientation to the {0001} plane being within the range of ±5° to the <1-100> direction, an off angle of said second plane orientation to the {03-38} plane in the <1-100> direction being greater than or equal to −3° and less than or equal to 3°, and an inclination of said second plane orientation to the (000-1) plane being less than 90°.

15. The silicon carbide semiconductor device according to claim 14, wherein
said surface of said silicon carbide layer further includes third to sixth regions, said third to sixth regions, at least partially, having third to sixth plane orientations respectively, said first to sixth plane orientations differing from each other, each off orientation of said first to sixth plane orientations to the {0001} plane being within the range of ±5° to the <1-100> direction, each off angle of each of said first to sixth plane orientations to the {03-38} plane in the <1-100> direction being greater than or equal to −3° and less than or equal to 3°, and each inclination of each of said first to sixth plane orientations to the (000-1) plane being less than 90°.

16. The silicon carbide semiconductor device according to claim 14, wherein an interface between said silicon carbide layer and said insulation film has an interface state density less than $5 \times 10^{11}$ cm$^{-2}$ eV$^{-1}$.

17. The silicon carbide semiconductor device according to claim 14, wherein said silicon carbide semiconductor device has an S value less than or equal to 200 mV/decade.

18. The silicon carbide semiconductor device according to claim 14, further comprising a gate electrode provided on said insulation film.

19. The silicon carbide semiconductor device according to claim 18, wherein said gate electrode constitutes a trench gate structure.

20. The silicon carbide semiconductor device according to claim 18, wherein said gate electrode constitutes a planar gate structure.

21. The silicon carbide semiconductor device according to claim 14, wherein said silicon carbide layer has channel mobility higher than or equal to 70 cm$^2$/Vs at room temperature on said surface.

22. The silicon carbide semiconductor device according to claim 21, wherein said silicon carbide layer has an impurity concentration greater than or equal to $1 \times 10^{17}$ cm$^{-3}$ on said surface.

23. The silicon carbide semiconductor device according to claim 22, wherein said silicon carbide semiconductor device has a threshold value greater than or equal to 4V.

24. The silicon carbide semiconductor device according to claim 14, wherein said silicon carbide layer has channel mobility higher than or equal to 100 cm$^2$/Vs at room temperature on said surface.

25. The silicon carbide semiconductor device according to claim 24, wherein said silicon carbide layer has an impurity concentration greater than or equal to $2 \times 10^{16}$ cm$^{-3}$ on said surface.

26. The silicon carbide semiconductor device according to claim 25, wherein said silicon carbide semiconductor device has a threshold value greater than or equal to 2.5V.

\* \* \* \* \*